United States Patent [19]
Corsi

[11] Patent Number: 6,002,288
[45] Date of Patent: Dec. 14, 1999

[54] CURRENT LIMITING CIRCUIT AND METHOD THAT MAY BE SHARED AMONG DIFFERENT CIRCUITRY

[75] Inventor: Marco Corsi, Plano, Tex.

[73] Assignee: Texas Instruments Incorporated, Dallas, Tex.

[21] Appl. No.: 08/989,956

[22] Filed: Dec. 12, 1997

Related U.S. Application Data

[60] Provisional application No. 60/032,968, Dec. 13, 1996.

[51] Int. Cl.⁶ .................................................. H03K 5/08
[52] U.S. Cl. ......................... 327/309; 327/108; 327/423; 327/588
[58] Field of Search ..................................... 327/316, 315, 327/309, 319, 322, 306, 108–111, 423, 424, 588; 330/146, 277, 293, 288; 360/46, 68

[56] References Cited

U.S. PATENT DOCUMENTS

| | | | |
|---|---|---|---|
| 4,771,228 | 9/1988 | Hester et al. | 323/314 |
| 5,191,297 | 3/1993 | Penman et al. | 330/146 |
| 5,262,713 | 11/1993 | Agiman | 323/312 |
| 5,386,336 | 1/1995 | Kim et al. | 361/100 |
| 5,444,409 | 8/1995 | Perraud | 327/315 |
| 5,451,897 | 9/1995 | Komuro | 330/253 |

*Primary Examiner*—Kenneth B. Wells
*Assistant Examiner*—Minh Nguyen
*Attorney, Agent, or Firm*—April M. Mosby; W. James Brady; Richard L. Donaldson

[57] ABSTRACT

A circuit (10) and method for limiting output currents in a circuit having at least two output drivers (12,14) with outputs (16,18) on which first and second out-of-phase output currents are produced includes a current source (34) and a first current mirror (28). The first current mirror (28) has a first side (30) connected to sense a current in the output drivers and has a second side (32) connected to the current source (34). A magnitude of the current in the output drivers (12,14) produces a proportional voltage at a connection (52) between the second side (32) and the current source (34). First and second control transistors (40,42) are each connected to provide a control current to control respective output currents of the drivers (12,14), the first and second control transistors (40,42) being connected to receive an input signal (46) to pass the control current. A circuit (48) is provided for modifying the control current to the first and second control transistors (40,42) according to the proportional voltage.

11 Claims, 1 Drawing Sheet

CURRENT LIMITING CIRCUIT AND METHOD THAT MAY BE SHARED AMONG DIFFERENT CIRCUITRY

This application claims priority under 35 USC § 119(e)(1) of provisional application Ser. No. 60/032,968 filed Dec. 13. 1996.

BACKGROUND OF THE INVENTION

1. Field of the Invention

This invention relates to improvements in current limiting circuitry and methods, and more particularly to improvements in current limiting circuits and methods that may be used in RS485 type circuits, or the like.

2. Relevant Background

Many circuits are constructed with at least two channels or sections that do not conduct simultaneously. Although many classes of such circuits exist, one class of such circuits are those that are designed according to the so-called "RS485" standard. Circuits of this type may have, for example, two or more drivers that source and/or sink out-of-phase outputs.

Such drivers may include, for example, "high side driver circuitry" in which two drivers are provided, only one of which being on any instant in time to source current to another circuit or application. In some circuits, "low side drivers" may also be included, in which two driver stages are provided to sink current from an application; again however, only one stage is operated to conduct at any instant in time. In some circuits of this type, both high and low side drivers are provided. In these cases, only one of the two high side drivers is on, and only one of the two low side drivers is on at any instant. Furthermore, although in an elemental sense, only a single stage is described, it is understood that typical circuitry of the type described may have a large number of stages associated with a single integrated circuit device.

In many applications involving circuits of this type, it is desirable to provide for a current limiting function in the circuit. Typically to provide for such current limiting function, a current limiting circuit is provided for each driver in the circuit. Thus, four current limiting circuits are required in a circuit of the type described having two high side drivers and two low side drivers. When the circuit is integrated onto a monolithic integrated circuit chip, the current limiting function occupies a large amount of the chip area that would otherwise be available for integrated circuit components. Moreover, when such current limiting circuitry is provided for each individual driver, the quiescent current demands may be significant.

What is needed therefore, is method and circuit for providing current limiting functions with minimized integrated circuit chip area requirements for circuits of the type described in which a plurality of current driver circuits are provided, but which source and/or sink at least partially out-of-phase output currents.

SUMMARY OF THE INVENTION

In light of the above, therefore, it is an object of the invention to provide a circuit and method that reduces the amount of active circuitry needed to implement an RS485 function, or the like.

It is another object of the invention to provide a circuit and method of the type described that enables the required size of large chips to be reduced.

It is still another object of the invention to provide a circuit and method of the type described that contributes to the reduction of quiescent current demands.

It is yet another object of the invention to proved a circuit and method of the type described that may be shared between low and high side driver circuits in applications such as those like RS485 driver circuits.

These and other objects, features and advantages of the invention will be apparent to those skilled in the art from the following detailed description of the invention, when read in conjunction with the accompanying drawings and appended claims.

Thus, according to a broad aspect of the invention, a circuit is presented for limiting output currents in a circuit having at least two output drivers for producing first and second out-of-phase output currents. The circuit includes a current source and a first current mirror. The first current mirror has a first side connected to sense a current in the output drivers and has a second side connected to the current source. A magnitude of the current in the output drivers produces a proportional voltage at a connection between the second side and the current source. First and second control transistors are each connected to provide a control current to control respective output currents of the drivers, the first and second control transistors being connected to receive an input signal to pass the control current. A circuit is provided for modifying the control current to the first and second control transistors according to the proportional voltage.

In one embodiment, each of the drivers includes a current mirror having one side connected to sense an output current from the driver and another side connected to mirror the output current to the first side of the first current mirror.

According to another broad aspect of the invention, a circuit is presented for limiting output currents in a circuit having at least two output drivers for producing first and second out-of-phase output currents. The circuit includes first and second driver transistors and first and second control transistors respectively connected in series with the first and second driver transistors. A replicating driver transistor and a replicating control transistor are also connected in series, the series being connected in current mirror relationship with the first and second driver transistors and the first and second control transistors. A current source is connected to establish a current through the replicating driver transistor and the replicating control transistor, and a drive current providing transistor is connected to provide drive current to the first and second driver transistors and the replicating driver transistor, based upon a current in the replicating driver transistor. According to still another broad aspect of the invention, a driver circuit is presented which includes first and second output drivers for producing first and second out-of-phase output currents, and a first circuit shared by the first and second output drivers for limiting current magnitudes of the first and second out-of-phase output currents. The driver circuit may also include third and fourth output drivers for producing third and fourth out-of-phase output currents, and a second circuit shared by the third and fourth output drivers for limiting current magnitudes of the third and fourth out-of-phase output currents. The first and second output drivers may be high-side driver circuits and the third and fourth output drivers may be low-side driver circuits. According to still another broad aspect of the invention, a method is presented for limiting output drive currents in a circuit having at least two output drivers for producing first and second out-of-phase output currents. The method includes the step of connecting a first circuit to the first and second output drivers for biasing the at least two output drivers to limit current magnitudes of the first and second out-of-phase output currents.

BRIEF DESCRIPTION OF THE DRAWINGS

The invention is illustrated in the accompanying drawings, in which.

In the various figures of the drawing, like reference numerals are used to denote like or similar parts.

DETAILED DESCRIPTION OF THE PREFERRED EMBODIMENTS

The circuit and technique of the invention has particular application to circuits of the type in which plural drivers are provided, but in which only one part of the driver is on at any one time. An example of such driver circuit to which the invention is particularly well suited are the circuits known as "RS485" circuits, although the principles of the invention are equally applicable to other circuits of the type described. Since only one side of the driver is on at any instant in time, the current limit circuit of the invention can be shared between both halves of the driver. This results in a reduction of the needed chip size and reduced number of components required to realize the invention.

Figure 1:
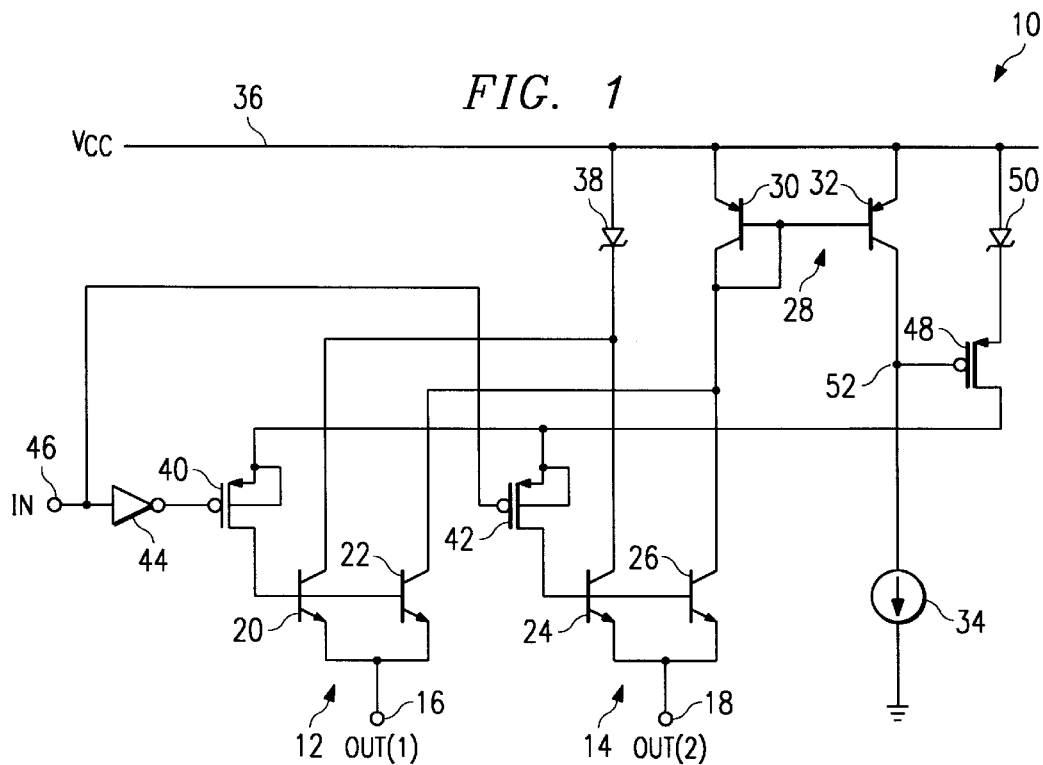
FIG. 1 is an electrical schematic diagram of a typical high side driver circuit incorporating current limiting circuitry in accordance with the circuit and method of a preferred embodiment of the invention.

An electrical schematic diagram of a high side driver circuit 10 that incorporates the current limiting circuit and technique according to a preferred embodiment of the invention is shown in FIG. 1. The circuit 10, which may be for example, a portion of a so-called "RS485 driver" circuit, includes two output circuits 12 and 14, each of which provides output current on respective output nodes 16 and 18. The output driver circuit 12 includes two NPN transistors 20 and 22, and the output driver 14 includes two NPN transistors 24 and 26. The NPN transistors 20 and 24 of the respective output drivers 12 and 14 provide output currents supplied through Schottky diode 38. As will be apparent, the outputs on the respective output nodes 16 and 18 are configured to be out-of phase.

The output currents delivered on nodes 16 and 18 are sensed by current mirror NPN transistors 22 and 26, respectively. Each of the sensing transistors 22 and 26 are connected to a PNP transistor 30 on a first side of a current mirror 28. On the other hand, a current source 34 is connected to a PNP transistor 32 on the second side of the current mirror 28.

The control of the conduction of currents through the driver transistors 20 and 22 of the driver 12 is controlled by a PMOS transistor 40. In a similar manner, the control of the conduction of currents through the driver transistors 24 and 26 of the driver circuit 14 is controlled by a PMOS transistor 42. The gate of the PMOS transistor 42 is connected directly to the input 46 of the circuit, and the gate of the PMOS transistor 40 is connected to the output of an inverter 44 that inverts the signal at the input 46 to the circuit 10. Therefore, the PMOS transistors 40 and 42 are driven out of phase so that only one or the other of the driver circuits 12 or 14 conducts at any instant in time.

The current flow through the PMOS transistors 40 and 42, which provides the base drive current for driver transistors 20 and 22, and 24 and 26, respectively, is provided by a PMOS transistor 48, which is connected by a Schottky diode 50 to the $V_{cc}$ rail 36. The gate of the PMOS transistor 48 is connected to node 52 at the connection of the collector of PNP transistor 32 to the current source 34.

In operation, it can be seen that as the current that flows through whichever of the NPN transistors 20 or 24 is conducting tends to rise, the voltage at node 52 begins also to rise towards $V_{CC}$. The rise in voltage at node 52 tends to turn off the conduction through the PMOS transistor 48, which, in turn, decreases the base drive current supplied by the selected PMOS transistor 40 or 42 to the selected driver transistors 20 and 22 or 24 and 26.

Figure 2:
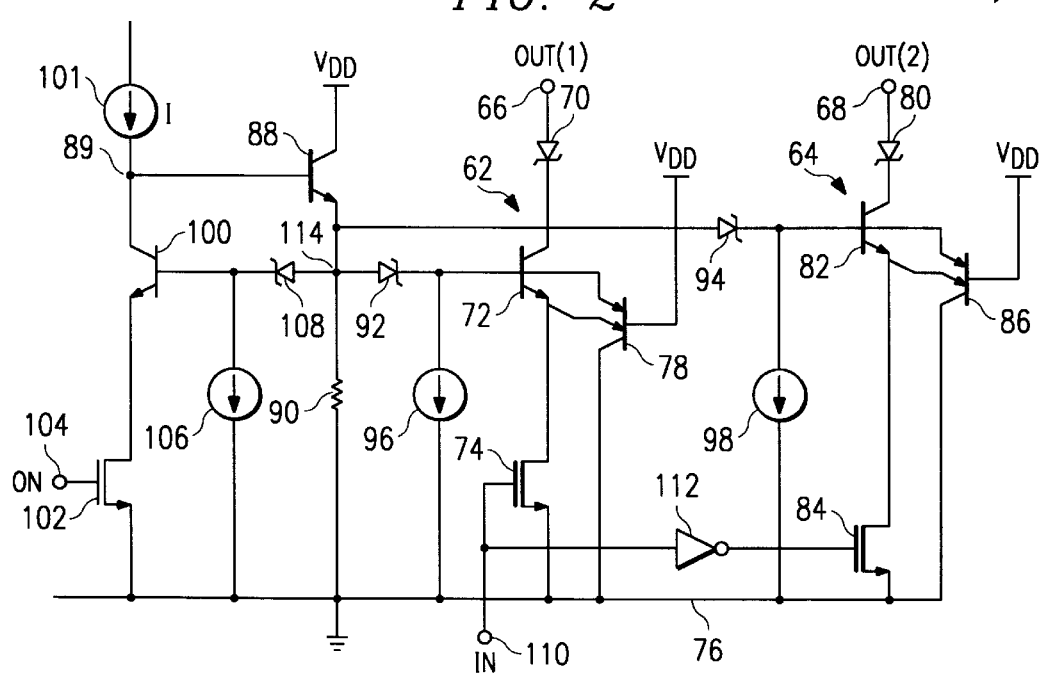
FIG. 2 is an electrical schematic diagram of a low side driver circuit that includes current limiting circuitry and techniques in accordance with a preferred embodiment of the invention.

An electrical schematic diagram of a low side driver circuit which includes current limiting circuitry and techniques according to a preferred embodiment of the invention is shown in FIG. 2. The circuit 60 includes two low side drivers 62 and 64 that provide outputs on respective output nodes 66 and 68. The driver circuit 62 includes a current flow path provided by a Schottky diode 70, an NPN transistor 72, and an NMOS transistor 74 connected in series between the first output node 66 and a ground bus 76. A PNP transistor 78 provides a breakdown protection clamp to prevent the base emitter junction of transistor 72 from breaking down.

Similarly, the low side driver circuit 64 includes a current flow path which includes a Schottky diode 80, an NPN transistor 82, and an NMOS transistor 84, connected in series between the second output node 68 and the ground bus 76. A PNP transistor 86 provides a breakdown protection clamp to prevent the base emitter junction of transistor 82 from breaking down.

A circuit comprising an NPN transistor 100 and an NMOS device 102 replicates the driver transistors 72 and 82 and their respective control transistors 74 and 84. A current source 101 supplies current to the replicating transistors 100 and 102. A voltage "ON" is applied to the gate of the transistor 102 on node 103 to insure that transistor 102 is biased on. The voltage "ON" is essentially the logic voltage required to turn the transistors on.

A biasing transistor 88 is provided to supply base bias current to the drive transistors 72 and 82 and to the replicating transistor 100. The NPN transistor 88 is connected between $V_{DD}$ and ground by a resistor 90, with its base connected to the node 89 between the current source 101 and the replicating transistor 100; thus, the current supplied to the drive transistors 72 and 82 and to the replicating transistor 100 via respective Schottky diodes 92, 94, and 108 is controlled by the magnitude of the current flowing through the replicating transistors 100 and 102. Additionally, the bases of the NPN driver transistor 72 and 82 are connected to respective current sources 96 and 98, and the base of the replicating transistor 100 is connected to current source 106.

The input to the circuit on input terminal 110 is connected to the gate of NMOS transistor 74 directly, and to the gate of NMOS transistor 84 by an inverter 112. Thus, it can be seen that the driver circuits 62 and 64 are driven essentially out of phase.

In operation, it can be seen that the current, I, supplied by the current source 101 controls the magnitude of the currents in the driver transistors 72 and 82. More particularly, the driver transistors 72 and 82 and their respective control transistors 74 and 84 are essentially connected as current mirrors to mirror the current in the replicating circuit, which includes transistors 100 and 102.

It should be noted that the current sources 96 and 98 are substantially identical and the current source 106 preferably is also the same. However, the current source 106, NPN transistor 100 and NMOS transistor 102 may be sized to have a different, known ratio to the elements of the driver circuits 62 and 64.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A circuit for limiting output currents in a circuit having at least two output drivers for producing first and second out-of-phase output currents, comprising:

a current source;

a first current mirror having a first transistor connected to sense a current in said output drivers and having a second transistor connected to said current source, wherein a magnitude of said current in said output drivers produces a proportional voltage at a connection between said second transistor and said current source;

first and second control transistors, each connected to provide a control current to control respective output currents of said drivers, said first and second control transistors being connected to receive an input signal to pass said control current; and a circuit coupled to said first and second control transistors for modifying the control current to said first and second control transistors according to said proportional voltage.

2. The circuit of claim 1 wherein each of said drivers comprises a current mirror having one transistor connected to sense an output current from the driver and another transistor connected to mirror said output current to said first transistor of said first current mirror.

3. The circuit of claim 1 wherein said circuit for modifying the control current to said first and second control transistors according to said proportional voltage comprises an MOS transistor having a gate connected to said connection and having a conduction path between a supply voltage and said first and second control transistors.

4. A circuit for limiting output currents in a circuit having at least two output drivers for producing first and second out-of-phase output currents, comprising:

first and second driver transistors;

first and second control transistors respectively connected in series with said first and second driver transistors;

a replicating driver transistor and a replicating control transistor, connected in series, said series being connected in current mirror relationship with said first and second driver transistors and said first and second control transistors;

a current source connected to establish a current through said replicating driver transistor and said replicating control transistor;

and a drive current providing transistor connected to provide drive current to said first and second driver transistors and said replicating driver transistor, based upon said current through said replicating driver transistor.

5. The circuit of claim 4 wherein said first and second driver transistors and said replicating driver transistor are bipolar transistors.

6. The circuit of claim 5 wherein said first and second control transistors and said replicating control transistor are MOS transistors.

7. A driver circuit, comprising:

first and second control transistors connected to receive an input signal to pass a control current;

first and second output drivers for producing first and second out-of-phase output currents, said first output driver coupled to said first control transistor for receiving said control current, said second output driver coupled to said second control transistor for receiving said control current;

a first circuit shared by said first and second output drivers for limiting current magnitudes of said first and second out-of-phase output currents, wherein said first circuit shared by said first and second output drivers comprises a current mirror having one transistor connected to receive said first and second out-of-phase output currents and another transistor coupled to a MOS transistor to modify said first and second out-of-phase output currents of said first and second output drivers.

8. The driver circuit of claim 7 further comprising:

third and fourth output drivers for producing third and fourth out-of-phase output currents;

a second circuit shared by said third and fourth output drivers for limiting current magnitudes of said third and fourth out-of-phase output currents.

9. The driver circuit of claim 7 wherein said first and second output drivers are high-side driver circuits and said third and fourth output drivers are low-side driver circuits.

10. The circuit of claim 7 wherein each of said first and second drivers comprises a current mirror having one side connected to sense an output current from the driver and another side connected to produce a driver mirror current that mirrors said output current.

11. The driver circuit of claim 7 wherein said first and second output drivers are connected in an "RS485" circuit.

* * * * *